(12) United States Patent
Nomura et al.

(10) Patent No.: US 7,785,977 B2
(45) Date of Patent: Aug. 31, 2010

(54) THIN FILM CAPACITOR AND MANUFACTURING METHOD THEREFOR

(75) Inventors: Masanobu Nomura, Yasu (JP); Yutaka Takeshima, Nagaokakyo (JP); Atsushi Sakurai, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/690,480

(22) Filed: Jan. 20, 2010

(65) Prior Publication Data

US 2010/0118468 A1    May 13, 2010

Related U.S. Application Data

(60) Division of application No. 11/865,873, filed on Oct. 2, 2007, now Pat. No. 7,675,139, which is a continuation of application No. PCT/JP2006/302254, filed on Feb. 9, 2006.

(30) Foreign Application Priority Data

Apr. 27, 2005   (JP) .............................. 2005-130171

(51) Int. Cl.
    *H01L 21/02*     (2006.01)
(52) U.S. Cl. ...................... 438/381; 438/329; 438/393; 438/396; 257/52; 257/E21.008; 257/E21.021
(58) Field of Classification Search ................ 438/329, 438/381, 393, 396; 257/532, E21.008, E21.021
    See application file for complete search history.

(56) References Cited

U.S. PATENT DOCUMENTS

| 6,483,691 B1 | 11/2002 | Nakamura |
| 7,446,363 B2 * | 11/2008 | Agarwal ...................... 257/296 |
| 2004/0130849 A1 * | 7/2004 | Kurihara et al. ............. 361/311 |
| 2007/0220725 A1 * | 9/2007 | Borland ..................... 29/25.42 |

FOREIGN PATENT DOCUMENTS

| JP | 11-204745 | 7/1999 |
| JP | 2004-214589 | 7/2004 |

* cited by examiner

*Primary Examiner*—Victor A Mandala
(74) *Attorney, Agent, or Firm*—Dickstein Shapiro LLP

(57) ABSTRACT

A thin film capacitor including a substrate, a capacitor portion having an upper conductor, a lower conductor, and a dielectric thin film, and a resin protective layer for protecting the capacitor portion. A barrier layer is interposed between the capacitor portion and the resin protective layer. The barrier layer includes a crystalline dielectric barrier layer formed in contact with the capacitor portion and having the same composition system as the dielectric thin film, and an amorphous inorganic barrier layer formed on the surface of the crystalline dielectric barrier layer and composed of silicon nitride having non-conductivity. The inorganic barrier layer prevents deterioration in the properties of the dielectric thin film by blocking diffusion of the constituent elements of the inorganic barrier layer toward the capacitor portion.

4 Claims, 3 Drawing Sheets

THIN FILM CAPACITOR AND MANUFACTURING METHOD THEREFOR

CROSS REFERENCE TO RELATED APPLICATIONS

The present application is a divisional of application Ser. No. 11/865,873, filed Oct. 2, 2007, which is a continuation of International Application No. PCT/JP2006/302254, filed Feb. 9, 2006, which claims priority to Japanese Patent Application No. JP2005-130171, filed Apr. 27, 2005, the entire contents of each of these applications being incorporated herein by reference in their entirety.

FIELD OF THE INVENTION

The present invention relates to a thin film capacitor used for decoupling an integrated circuit and a manufacturing method therefore.

BACKGROUND OF THE INVENTION

Decoupling capacitors have been used with increases in processing speed of integrated circuits. Decoupling capacitors are required to have low ESL (Equivalent Series Inductance). As a decoupling capacitor satisfying this requirement, there has been known a thin film capacitor having a capacitor portion which is formed on a Si substrate by a thin film technique such as a sputtering or sol-gel method.

Such a thin film capacitor is coated with a protective layer composed of a resin material for mechanically reinforcing a capacitor portion. For example, Patent Document 1 has proposed a thin film capacitor including a capacitor having a dielectric layer composed of a metal oxide and a protective insulating layer composed of a resin material, a barrier layer composed of a nonconductive inorganic material being provided between the capacitor and the protective insulating layer.

As shown in FIG. 4, the thin film capacitor of Patent Document 1 includes a Si substrate 101, a capacitor 109 having a lower electrode layer 102, a dielectric layer 103 composed of barium strontium titanate (referred to as "BST" hereinafter), and an upper electrode layer 104, which are formed in order on the Si substrate 101, a barrier layer 105 formed to cover the capacitor 109, a protective insulating layer 106 formed on the barrier layer 105 and composed of a resin material, electrode pads 107, and bumps 108.

The barrier layer 105 is provided for preventing the dielectric layer 103 composed of BST from being reduced with moisture released from the resin material contained in the protective insulation layer 106. Examples of a material preferably used for forming the barrier layer 105 include amorphous materials, such as silicon nitride ($Si_3N_4$), aluminum oxide ($Al_2O_3$), silicon oxide ($SiO_2$), and amorphous BST.

Patent Document 1: Japanese Unexamined Patent Application Publication No. 2004-214589

However, in the thin film capacitor described in Patent Document 1, the barrier layer 105 composed of an amorphous nitride such as amorphous silicon nitride may diffuse nitrogen atoms toward the dielectric layer 103 through the upper electrode layer 104 to change the composition of BST, thereby failing to obtain desired electric properties.

Also, the barrier layer 105 composed of amorphous aluminum oxide or amorphous silicon oxide may diffuse aluminum or silicon toward the dielectric layer 103. Therefore, such a material is undesirable.

Further, heat treatment is required for thermally curing the resin constituting the protective insulating layer 106. However, the barrier layer composed of an amorphous oxide such as amorphous BST causes the problem that the amorphous oxide takes oxygen away from the dielectric layer 103 through the upper electrode layer 104. Consequently, the composition of the dielectric layer 103 is changed, thereby failing to achieve desired electric properties. This is because an amorphous oxide is generally assumed to have the oxygen content smaller than the stoichiometric composition. Thus, oxygen is taken away from the dielectric layer 103 of crystalline BST having a higher oxygen content than that of the amorphous oxide. The barrier layer 105 composed of crystalline BST, not amorphous BST, does not cause the problem as described above. However, as described in Patent Document 1, the barrier layer 105 composed of crystalline BST can produce substantially no barrier effect.

After all, in the invention described in Patent Document 1, the properties of the dielectric layer 103 may be degraded by providing the barrier layer 105.

SUMMARY OF THE INVENTION

The present invention has been achieved in consideration of the above-mentioned situation. The object of the present invention is to provide a thin film capacitor capable of preventing deterioration of properties even when a layer with a barrier function is provided between a capacitor portion and a resin protective layer (protective insulation layer), and a manufacturing method therefor.

In order to achieve the object, a thin film capacitor according to the present invention includes a substrate, a capacitor portion formed on the substrate and including a plurality of conductor layers and a dielectric thin film, and a resin protective layer for protecting the capacitor portion, wherein a barrier layer is interposed between the capacitor portion and the resin protective layer, and the barrier layer includes a crystalline dielectric barrier layer which is formed in contact with the capacitor portion and which has the same composition system as the dielectric thin film and a non-conductive amorphous inorganic barrier layer formed on the surface of the dielectric barrier layer.

In the present invention, the term "the same composition system" means that the constituent elements are the same and includes the idea that the molar content ratios of the constituent elements are different. For example, when the dielectric thin film and the barrier layer are formed using (Ba, Sr)$TiO_3$ (BST), the dielectric thin film and the dielectric barrier layer have the same composition system even when the molar content ratios of Ba and Sr are different.

In the thin film capacitor of the present invention, the inorganic barrier layer preferably contains at least one material selected from silicon nitride, aluminum oxide, and silicon oxide. Silicon nitride is particularly preferred from the viewpoint of improvement in moisture resistance because the moisture resistance can be obtained with a relatively small film thickness.

In the present invention, "silicon nitride" is preferably $Si_3N_4$ having the stoichiometric composition in which the molar ratio of silicon to nitrogen is 3:4, but the silicon nitride is not necessarily limited to this. The silicon nitride may have a silicon/nitrogen molar ratio different from that of the stoichiometric composition as long as it has non-conductivity and moisture resistance. In this sense, in the specification, the silicon nitride may be denoted by $SiN_x$.

In the thin film capacitor of the present invention, the crystalline dielectric barrier layer preferably has the same composition as the dielectric thin film.

Further, in the thin film capacitor of the present invention, an adhesive layer composed of a material with the same composition system as the dielectric thin film is provided between the substrate and the capacitor portion.

The adhesive layer preferably has the same composition system as the dielectric thin film.

A method of manufacturing a dielectric thin film capacitor according to the present invention includes a step of applying a first dielectric raw material solution containing an organic metal compound on a substrate and heating the solution to form an adhesive layer, a step of alternately depositing, on the adhesive layer, a conductor layer and a dielectric thin film formed by applying a second dielectric raw material solution with the same composition system as that of the first electric raw material solution to form a capacitor portion, a step of applying, on the capacitor portion, a third dielectric raw material solution with the same composition system as that of the first or second electric raw material solution and heating the solution to form a crystalline dielectric barrier layer, a step of performing a heat treatment at a temperature of 750° C. or more in an oxygen atmosphere, a step of forming a non-conductive amorphous inorganic barrier layer on the dielectric barrier layer, and a step of forming a resin protective layer on the inorganic barrier layer.

A thin film capacitor of the present invention includes a substrate, a capacitor portion formed on the substrate and including a plurality of conductor layers and dielectric thin film, a resin protective layer for protecting the capacitor portion, and a barrier layer interposed between the capacitor portion and the resin protective layer, the barrier layer including a crystalline dielectric barrier layer formed in contact with the capacitor portion and having the same composition system as the dielectric thin film and a non-conductive amorphous inorganic barrier layer (silicon nitride, aluminum oxide, or silicon oxide) formed on the surface of the dielectric barrier layer. Therefore, the moisture resistance of the capacitor portion can be improved by the inorganic barrier layer and diffusion of the constituent components of the inorganic barrier layer toward the capacitor portion can be prevented by the crystalline dielectric barrier layer, thereby preventing the influence of the inorganic barrier layer on the properties of the dielectric thin film. Since the dielectric barrier layer has the same composition system as that of the dielectric thin film, the properties of the dielectric thin film are not degraded even when the components of the dielectric barrier layer diffuse toward the capacitor portion.

In particular, when the dielectric barrier layer has the same composition system as that of the dielectric thin film, these can be formed through the same process using the same raw materials, thereby decreasing the manufacturing cost.

Further, an adhesive layer composed of a material with the same composition system as the dielectric thin film is provided between the substrate and the capacitor portion, so that the adhesion between the substrate and the capacitor portion can be improved. In particular, the conductor layers composed of Pt have weak adhesion to Si generally used for the substrate. Thus, the adhesion between the substrate and the capacitor portion can be improved by providing the adhesive layer between the substrate and the capacitor portion. In addition, the adhesive layer has the same composition system as the dielectric thin film, and thus the properties of the dielectric thin film are not degraded even when the component of the dielectric barrier diffuses toward the capacitor portion.

In particular, the adhesive layer having the same composition system as that of the dielectric thin film can be formed through the same process using the same raw materials as those of the dielectric thin film. Therefore, the manufacturing cost is decreased.

A method of manufacturing a dielectric thin film capacitor according to the present invention includes a step of applying a first dielectric raw material solution containing an organic metal compound on a substrate and heating the solution to form an adhesive layer, a step of alternately depositing, on the adhesive layer, a conductor layer and a dielectric thin film formed by applying a second dielectric raw material solution with the same composition system as that of the first electric raw material solution to form a capacitor portion, a step of applying, on the capacitor portion, a third dielectric raw material solution with the same composition system as that of the first or second electric raw material solution and heating the solution to form a crystalline dielectric barrier layer, a step of performing a heat treatment at a temperature of 750° C. or more in an oxygen atmosphere, a step of forming a non-conductive amorphous inorganic barrier layer on the dielectric barrier layer, and a step of forming a resin protective layer on the inorganic barrier layer. Thus, it is possible to manufacture a thin film capacitor having the above constitution without deteriorating the properties of the dielectric thin film.

Figure 1:
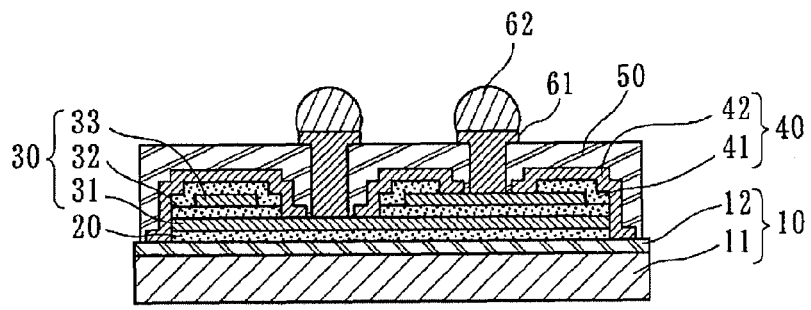
FIG. 1 is a sectional view showing a thin film capacitor according to an embodiment of the present invention.

REFERENCE NUMERALS 10 substrate
20 adhesive layer
30 capacitor portion
31 lower conductor (conductor layer)
32 dielectric thin film
33 upper conductor (conductor layer)
40 barrier layer
41 dielectric barrier layer
42 inorganic barrier layer
50 resin protective layer

DETAILED DESCRIPTION OF THE INVENTION

An embodiment of the present invention will be described with reference to the drawings.

FIG. 1 is a sectional view showing a thin film capacitor according to an embodiment of the present invention.

The thin film capacitor includes a substrate 10, an adhesive layer 20, a capacitor portion 30 including a lower conductor 31, a dielectric thin film 32, and an upper conductor 33, which are formed in order on the adhesive layer 20, a barrier layer 40 having a two-layer structure including a dielectric barrier layer 41 and an inorganic barrier layer 42 which are formed in order to cover the capacitor portion 30, a resin protective layer 50 formed to cover the barrier layer 40, electrode pads 61 electrically connected to one of the lower conductor 31 and the upper conductor 33 and drawn out to the top surface through the resin protective layer 50, and bumps 62 formed on the respective electrode pads 61.

The substrate 10 includes a Si layer 11 and a $SiO_2$ film 12 formed on the surface of the Si layer 11.

The adhesive layer 20, the dielectric thin film 32, and the dielectric barrier layer 41 are composed of crystalline BST and, in this embodiment, have the same composition, i.e., the same molar content ratio of each constituent element of BST. The lower conductor 31 and the upper conductor 33 are composed of Pt. The inorganic barrier layer 42 is provided for improving moisture resistance and, in this embodiment, composed of amorphous silicon nitride ($SiN_x$). The resin protective layer 50 is formed by thermally curing photosensitive BCB (benzocyclobutene).

In this embodiment, the inorganic barrier layer 42 is provided in contact with the lower surface of the resin protective layer 50. Therefore, the barrier effect of the inorganic barrier layer 42 can prevent the dielectric thin film 32, i.e., BST, from being reduced with moisture released from the BCB resin of the resin protective layer 50, and can improve the moisture resistance of the capacitor portion 30. In addition, since the crystalline dielectric barrier layer 41 is interposed between the inorganic barrier layer 42 and the capacitor portion 30, it is possible to inhibit diffusion of the inorganic barrier layer 42, i.e., amorphous silicon nitride ($SiN_x$), toward the capacitor portion 30. Therefore, the dielectric thin film 32 is not influenced by the inorganic barrier layer 42, and deterioration of the properties of the thin film capacitor can be prevented.

Further, the adhesive layer 20, the dielectric thin film 32, and the dielectric barrier layer 41 have the same composition and can thus be formed through the same process using the same raw material. Therefore, the manufacturing cost can be decreased.

Next, the method for manufacturing the thin film capacitor will be described.

Figure 2:
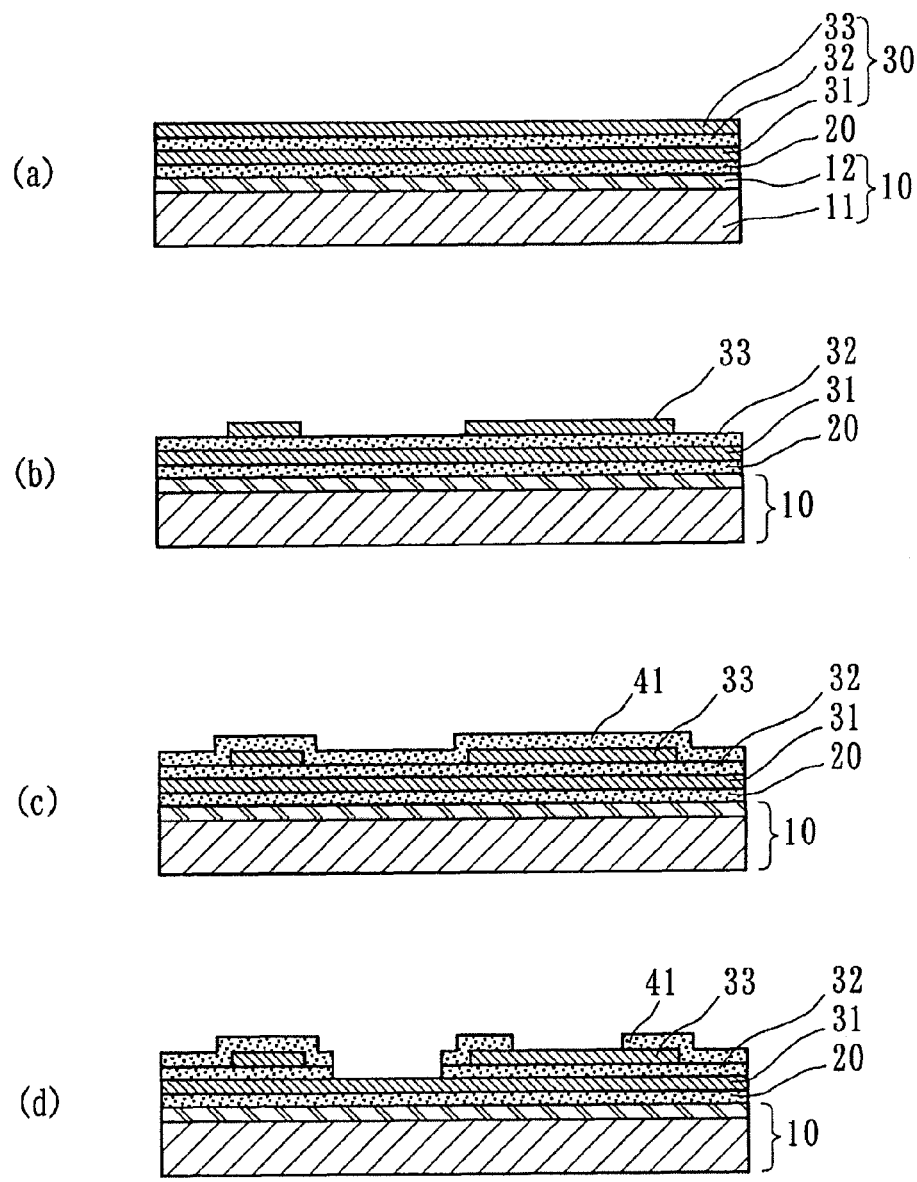
FIG. 2 is a sectional view (1/2) showing steps for manufacturing a thin film capacitor according to an embodiment of the present invention.

First, as shown in FIG. 2(a), the substrate 10 including the Si layer 11 and the $SiO_2$ layer 12 formed on the surface of the Si layer 11 is prepared. The adhesive layer 20 composed of crystalline BST having a thickness of 100 nm is formed on the substrate 10. Then, the lower conductor 31 composed of Pt having a thickness of 200 nm, the dielectric thin film 32 composed of crystalline BST having a thickness of 100 nm, and the upper conductor 33 composed of Pt having a thickness of 200 nm are deposited in order on the adhesive layer 20 to form the capacitor portion 30.

Specifically, the adhesive layer 20 can be formed by a MOD (Metal Organic Decomposition) method. Namely, a dielectric raw material solution (first dielectric raw material solution) containing an organometallic compound prepared at a molar ratio of Ba:Sr:Ti=7:3:10 is applied on the substrate 10 by spin coating, dried, and then heat-treated in an oxygen atmosphere, for example, at 650° C. for 30 minutes to form the adhesive layer 20. The lower conductor 31 and the upper conductor 33 can be formed by, for example, a sputtering method.

The dielectric thin film 32 can be formed by applying a dielectric raw material solution (second dielectric raw material solution) having the same composition as that used for the adhesive layer 20 by spin coating, drying, and then heat treatment in an oxygen atmosphere, for example, at 650° C. for 30 minutes. In this step, the dielectric thin film 32 need not be sufficiently crystallized.

Next, a photoresist is applied on the upper conductor 33, followed by exposure, development, and ion milling to pattern the upper conductor 33 as shown in FIG. 2(b).

Next, a dielectric raw material solution (third dielectric raw material solution) having the same composition as that used for the adhesive layer 20 and the dielectric thin film 32 is applied by spin coating, dried, and then heat-treated in an oxygen atmosphere, for example, at 650° C. for 30 minutes to form the dielectric barrier layer 41 having a thickness of 100 nm as shown in FIG. 2(c). Although, in this step, the dielectric barrier layer 41 need not be sufficiently crystallized, the dielectric barrier layer 41 is required to be sufficiently crystallized until the resin protective layer 50 shown in FIG. 1 is thermally cured.

Next, heat treatment is performed in an oxygen atmosphere at a temperature of 750° C. or more, for example, 850° C., for 30 minutes to increase the crystallinity of the dielectric thin film 32 and improve the dielectric constant. The heat treatment also can increase the crystallinity of the adhesive layer 20 and the dielectric barrier layer 41.

Next, a photoresist is applied on the dielectric barrier layer 41, followed by exposure, development, and wet etching to partially remove the dielectric barrier layer 41 and the dielectric thin film 32 as shown in FIG. 2(d) and partially expose the upper conductor 33 and the lower conductor 31.

Figure 3:
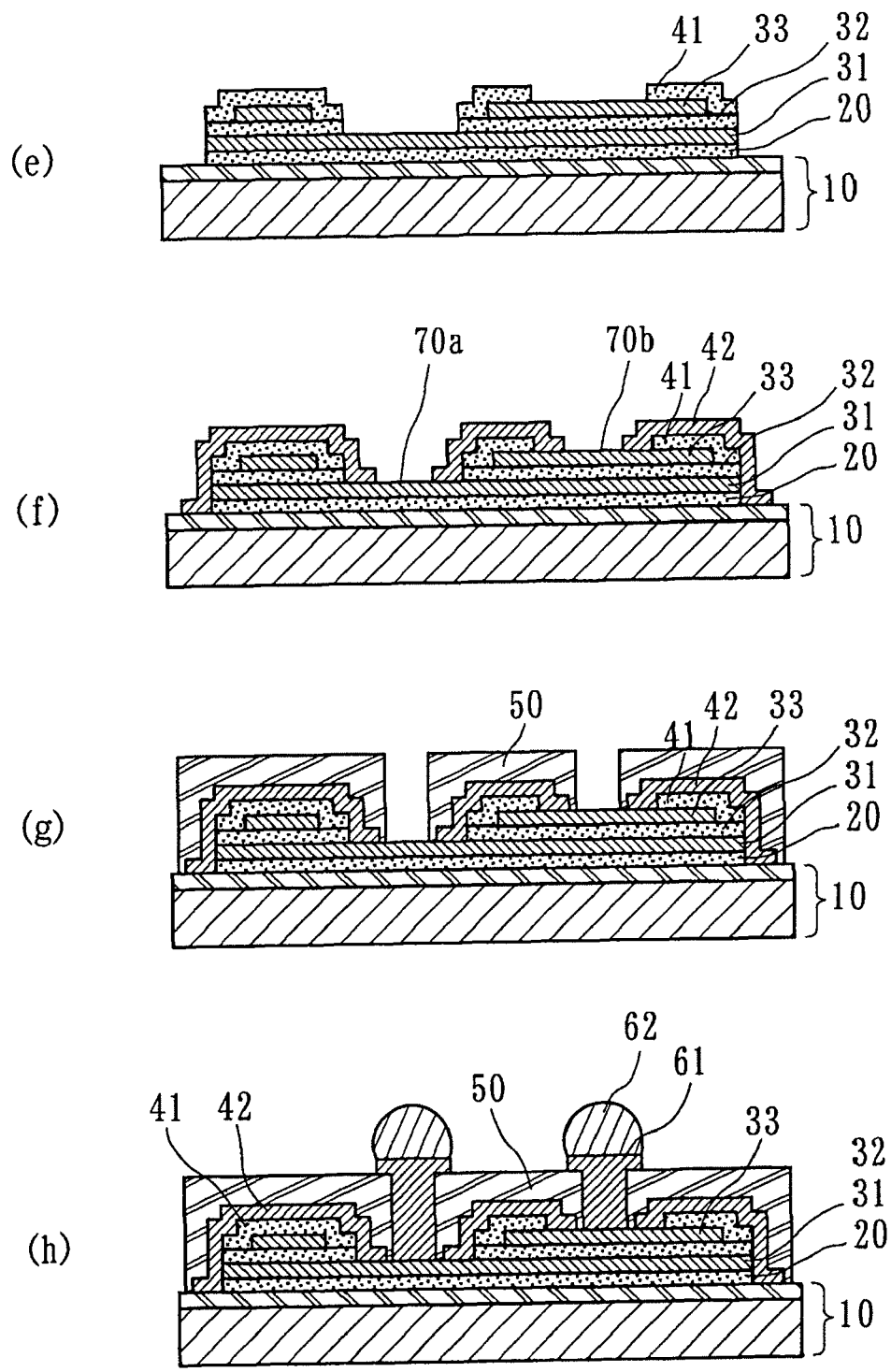
FIG. 3 is a sectional view (2/2) showing steps for manufacturing a thin film capacitor according to an embodiment of the present invention.
Figure 4:
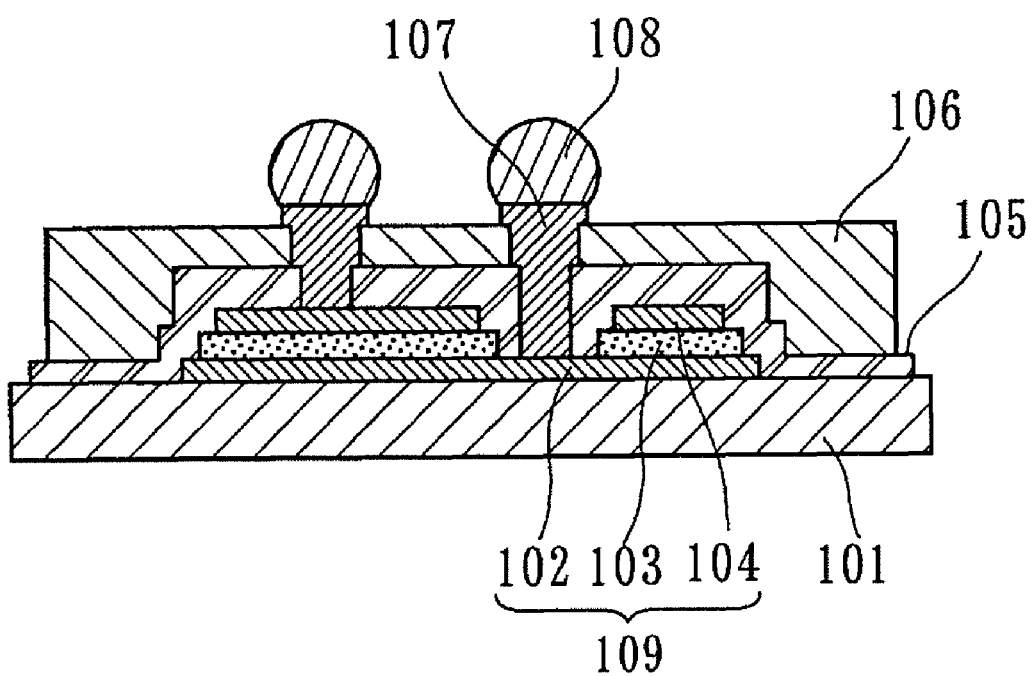
FIG. 4 is a sectional view showing an example of conventional thin film capacitors.

Further, a photoresist is applied, followed by exposure, development, and ion milling to partially remove the adhesive layer 20, the lower conductor 31, the dielectric barrier layer 32, the upper conductor 33, and the dielectric barrier layer 41 near the peripheral edge of the substrate 10 as shown in FIG. 3(e).

Next, silicon nitride ($SiN_x$) is deposited to a thickness of 500 nm by sputtering. Then, a photoresist is applied, followed by exposure, development, and reactive ion etching to partially expose the upper conductor 33 and the lower conductor 31 as shown in FIG. 3(f). As a result, apertures 70a and 70b are provided, and the inorganic barrier layer 42 composed of silicon nitride ($SiN_x$) is formed.

Next, photosensitive BCB resin is applied, followed by exposure, development, and then thermal curing at, for example, 250° C. to form the resin protective layer 50 as shown in FIG. 3(g).

Next, a Ti film having a thickness of 50 nm, a Ni film having a thickness of 2,000 nm, and an Au film having a thickness of 100 nm are deposited in order by sputtering to form the electrode pads 61 as show in FIG. 3(h). Next, Sn—Ag—Cu solder paste is printed on the electrode pads 61, followed by reflowing at a temperature of, for example, 240° C., to form the bumps 62. As a result, the thin film capacitor is manufactured.

In the method for manufacture the thin film capacitor, reduction of the dielectric thin film 32 can be prevented by the resin protective layer 50, and the moisture resistance of the capacitor portion 30 can be improved. In addition, the crystalline dielectric barrier layer 41 is formed between the inorganic barrier layer 42 and the capacitor portion 30, and thus nitrogen atoms of silicon nitride constituting the inorganic barrier layer 42 can be prevented from diffusing toward the dielectric thin film 32 in thermal curing of the resin protective layer 50 and heat treatment reflowing. Therefore, it is possible to prevent deterioration in properties of the dielectric thin film 32.

The present invention is not limited to the above-described embodiment, and various modifications may be made within the scope and gist thereof. For example, the substrate 10 is required for forming the capacitor portion 30 (the lower conductor 31, the upper conductor 33, and the dielectric thin film 32), but when the mechanical strength of the capacitor 30 can be secured, the substrate 10 may be omitted by an appropriate method because the substrate 10 is irrelevant to the electric operation of the thin film capacitor.

Although, in the above-described embodiment, the adhesive layer 20, the dielectric thin film 32, and the dielectric barrier layer 41 are composed of crystalline BST having the same composition, the properties of the dielectric thin film 32 are not deteriorated because the same composition system is used. Therefore, the molar content ratio of each constituent element of BST may be different in these layers.

The material of the dielectric thin film is not particularly limited as long as it is a metal oxide having a perovskite structure which can exhibit a high dielectric constant. As well as BST, barium titanate, strontium titanate, lead titanate, and lead titanate zirconate can be used as the material of the dielectric thin film. Other examples include materials having a bismuth layered structure, such as bismuth titanate, bismuth strontium tantalate, bismuth barium tantalate, bismuth strontium niobate, and bismuth barium niobate; and materials having a tungsten bronze structure, such as barium strontium niobate.

The method for forming the dielectric thin film 32 is not limited to the MOD method, and, for example, a sputtering method may be used. When the dielectric thin film 32 composed of BST is formed by the sputtering method, the film is deposited with a RF power of 400 W and at a substrate temperature of 300° C. and a gas pressure of 2.3 Pa and then crystallized by heat treatment at 850° C. for about 30 minutes in an oxygen atmosphere to achieve a high dielectric constant. Similarly, the adhesive layer 20 and the dielectric barrier layer 41 may be formed by sputtering.

The capacitor portion 30 may have a structure including two dielectric thin films 32 or more, and each of the upper conductor 31 and the lower conductor may have a multi-layer structure. Although, in this embodiment, the upper conductor 31 and the lower conductor 33 are composed of Pt, a noble metal material can be used because it has oxidation resistance in heat treatment at a high temperature when the dielectric thin film 32 is formed. Instead of Pt, for example, Ir, Ru, Au, or Pd can be used.

As the material used for the inorganic barrier layer 42, aluminum oxide or silicon oxide can be used instead of silicon nitride. However, in order to improve the moisture resistance with a relatively small film thickness, as in the embodiment, silicon nitride is preferably used.

Although, in the embodiment, BCB is used for the resin protective layer 50, the material is not limited to this. A polyimide resin, an epoxy resin, or an acrylic resin can be used.

The thickness of each of the films described in the embodiment is only an example, and, of course, the thickness may be arbitrarily determined within a range in which a thin film capacitor having low ESL can be obtained.

The invention claimed is:

1. A method of manufacturing a dielectric thin film capacitor, the method comprising:
    applying a first dielectric raw material solution containing an organic metal compound on a substrate and heating the solution to form an adhesive layer;
    alternately depositing, on the adhesive layer, a conductor layer and a dielectric thin film formed by applying a second dielectric raw material solution with a composition system the same as that of the first dielectric raw material solution and heating the second solution to form a capacitor portion;
    applying, on the capacitor portion, a third dielectric raw material solution with a composition system the same as that of the first or second dielectric raw material solution and heating the third solution to form a crystalline dielectric barrier layer;
    heat treating at a temperature of 750° C. or more in an oxygen atmosphere;
    forming a non-conductive amorphous inorganic barrier layer on the dielectric barrier layer; and
    forming a resin protective layer on the inorganic barrier layer.

2. The thin film capacitor according to claim 1, wherein the non-conductive amorphous inorganic barrier layer contains at least one material selected from silicon nitride, aluminum oxide, and silicon oxide.

3. The thin film capacitor according to claim 1, wherein the crystalline dielectric barrier layer is composed of crystalline barium strontium titanate.

4. The thin film capacitor according to claim 1, wherein the resin protective layer is composed of a material selected from benzocyclobutene resin, polyimide resin, epoxy resin, and acrylic resin.

* * * * *